United States Patent [19]
Siegel et al.

[11] Patent Number: 5,570,273
[45] Date of Patent: Oct. 29, 1996

[54] SURFACE MOUNTABLE INTEGRATED CIRCUIT PACKAGE WITH LOW-PROFILE DETACHABLE MODULE

[75] Inventors: Harry M. Siegel, Hurst; Tom Q. Lao, Irving; Krishnan Kelappan, Carrollton; Michael J. Hundt, Double Oak, all of Tex.

[73] Assignee: SGS-Thomson Microelectronics, Inc., Carrollton, Tex.

[21] Appl. No.: 225,227

[22] Filed: Apr. 8, 1994

Related U.S. Application Data

[63] Continuation-in-part of Ser. No. 114,750, Aug. 31, 1993, abandoned.

[51] Int. Cl.[6] ........................................................ H01R 9/00
[52] U.S. Cl. .......................... 361/773; 361/772; 361/807; 361/813; 174/261; 257/672
[58] Field of Search ........................... 361/760, 766, 361/772, 794, 773, 786, 807, 813; 257/666, 676, 672; 439/60, 59, 70, 72; 174/250, 261, 262

[56] References Cited

U.S. PATENT DOCUMENTS

| D. 82,797 | 12/1930 | Cole. | |
|---|---|---|---|
| D. 317,592 | 6/1991 | Yoshizawa | D13/182 |
| 3,501,582 | 3/1970 | Heidler et al. | 174/52 |
| 3,650,232 | 3/1972 | Heinlen | 131/1 |
| 3,762,039 | 10/1973 | Douglass et al. | 29/588 |
| 3,891,898 | 6/1975 | Damon | 317/101 |
| 4,107,555 | 8/1978 | Haas et al. | 307/308 |
| 4,149,028 | 4/1979 | Gressitt et al. | 174/65 |
| 4,169,642 | 10/1979 | Mouissie | 339/17 F |
| 4,422,703 | 12/1983 | Christensen et al. | 339/74 |
| 4,646,132 | 2/1987 | Kuwabara et al. | 357/80 |
| 4,868,349 | 9/1989 | Chia | 174/52.4 |
| 4,920,444 | 4/1990 | Friman | 361/56 |
| 4,935,581 | 6/1990 | Komathu | 174/52.4 |
| 4,992,987 | 2/1991 | Echols et al. | 365/229 |
| 5,038,253 | 8/1991 | Repplinger et al. | 361/417 |
| 5,119,269 | 6/1992 | Nakayama | 361/380 |
| 5,130,881 | 7/1992 | Hilland | 361/56 |
| 5,131,535 | 7/1992 | O'Connor et al. | 206/329 |

FOREIGN PATENT DOCUMENTS

| 0438905 | 7/1991 | European Pat. Off. . |
| 3418363 | 11/1985 | Germany . |

OTHER PUBLICATIONS

Cole, "Designer's Dream Machine," Electronics, Mar. 5, 1987, pp. 53–57.

Primary Examiner—Leo P. Picard
Assistant Examiner—Y. Whang
Attorney, Agent, or Firm—Rodney M. Anderson; Lisa K. Jorgenson

[57] ABSTRACT

A molded integrated circuit package system of the type suitable for surface mounting is disclosed. The system includes a chip package having leads along its sides that are of the surface-mountable type, and having a plurality of connectors at its ends. A module is provided which contains components that are sensitive to solder temperatures or the chemicals used in the soldering process; examples of such components include batteries and quartz crystal resonators. The components may be disposed directly over the chip package or, in order to reduce the height of the package system, one or both of the components may be disposed outside of the outline of the chip package. The module has connectors extending therefrom that mate with the connectors on the chip package, such that the module may be removably connected to the chip package after the surface mounting of the chip package to a circuit board. Mechanical connection may be provided by snap members extending from the module which engage surfaces of the chip package when mounted thereto. Lockout tabs are provided on the chip package and the module to prevent improper mounting and electrical connection.

16 Claims, 14 Drawing Sheets

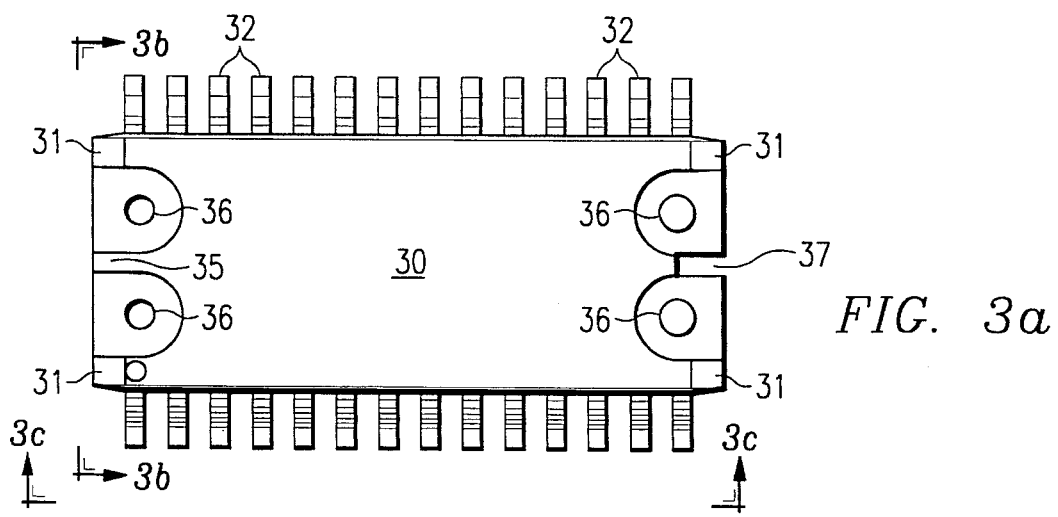
FIG. 3a
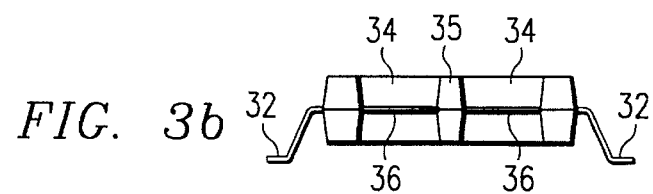
FIG. 3b
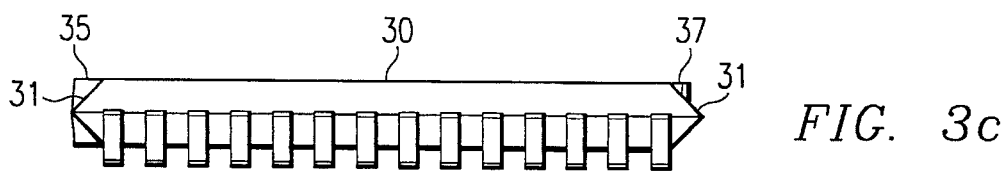
FIG. 3c
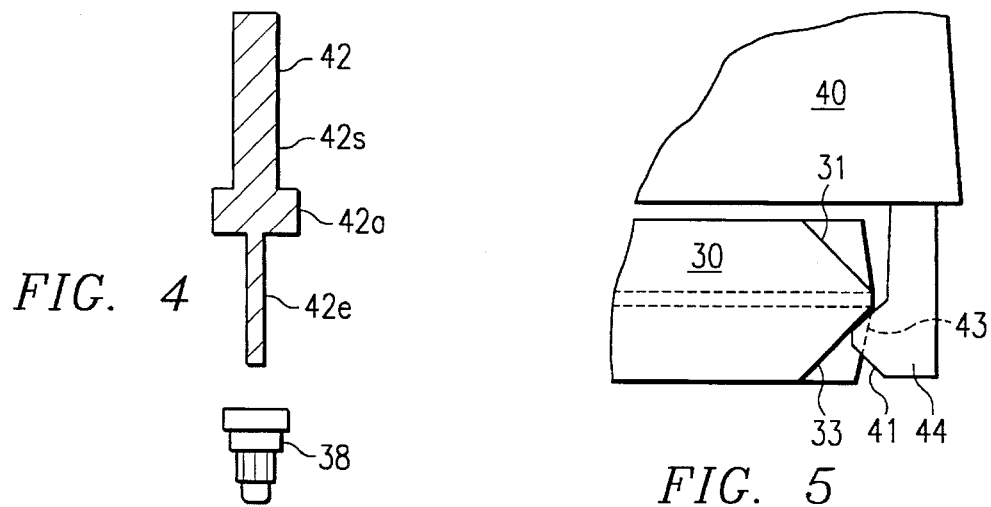
FIG. 4
FIG. 5

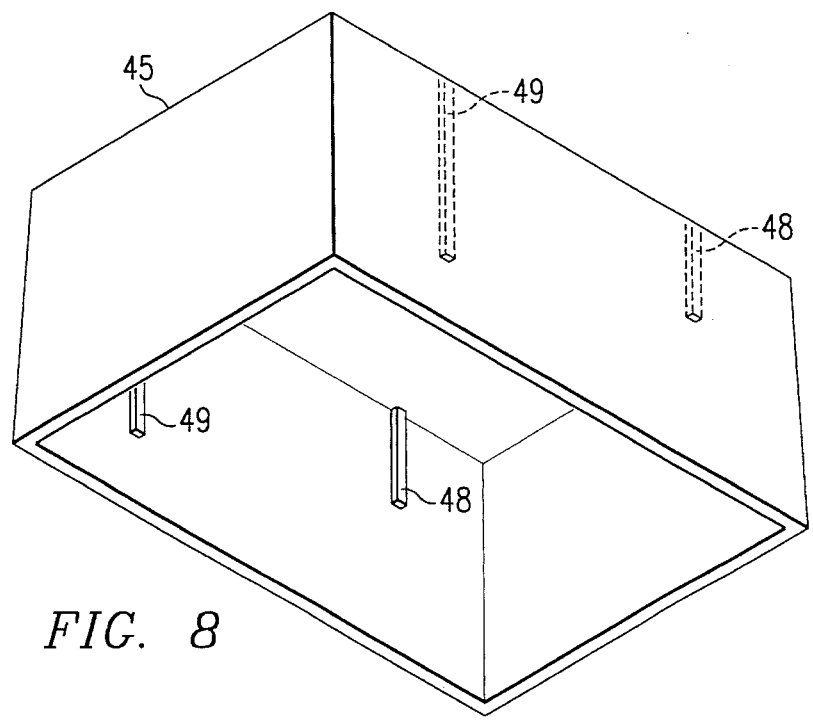
FIG. 8
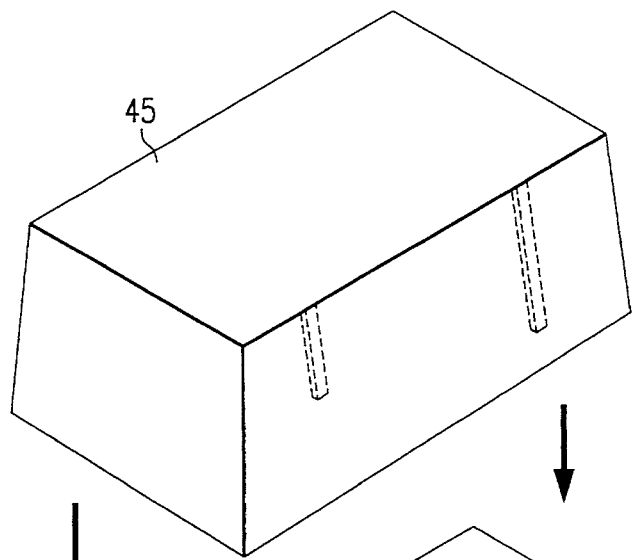
FIG. 9
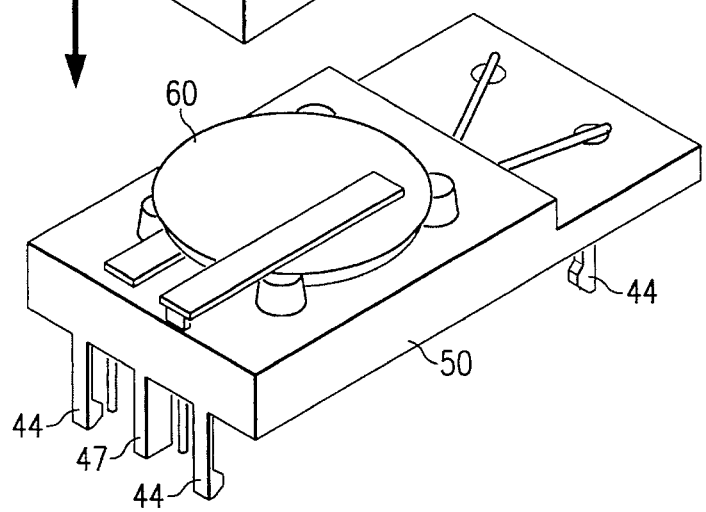

SURFACE MOUNTABLE INTEGRATED CIRCUIT PACKAGE WITH LOW-PROFILE DETACHABLE MODULE

This application is a continuation-in-part of application Ser. No. 08/114,750, filed Aug. 31, 1993, now abandoned entitled "Surface Mountable Integrated Circuit Package with Detachable Module", assigned to SGS-Thomson Microelectronics, Inc.

This invention is in the field of integrated circuits, and is more specifically directed to surface mount packages for the same.

BACKGROUND OF THE INVENTION

In the field of electronic system manufacturing, the use of surface mount technology to attach and connect integrated circuit components onto printed circuit boards has continued to grow. As is known in the art, surface mountable integrated circuit packages have leads which are folded or bent to allow for their solder connection to a planar surface of a circuit board, eliminating the need for plated-through holes through the circuit board. Surface mount technology thus increases the theoretical component density of the circuit board, as well as the degrees of freedom available to the board designer, as the location of integrated circuit leads need only be considered for a single surface plane of a multi-layer circuit board, rather than for all planes of the board.

However, the surface mountable integrated circuit is subjected to greater thermal and mechanical stress during the assembly procedure than are integrated circuits of the dual-in-line and similar package types. The mounting of a dual-in-line integrated circuit package to the circuit board is accomplished by wave solder of the underside of the circuit board (i.e., the side opposite that of the integrated circuit), as the pins of the integrated circuit package extend through plated-through holes in the circuit board. Accordingly, the circuit board itself insulates the integrated circuit package body from the high solder temperatures and harsh chemicals to which the soldered lead tips are subjected. Since the leads of a surface mountable package are soldered at the same surface at which the integrated circuit package body is located, however, the integrated circuit package body and its contents are directly subjected to the high temperature of the flowing solder, and to harsh chemicals used in the soldering process, such as flux, solder, and cleaning solvents.

Conventional surface-mountable integrated circuits that contain only a semiconductor device and its wire connections are generally able to withstand the thermal, chemical and mechanical stresses presented by the surface mount process. As such, the use of surface mount techniques in the manufacture of circuit boards of many types has become widespread, obtaining the density advantages provided by this technology.

In recent years, the use of battery power for many electronic circuit functions has become available, primarily due to advances made in complementary metal-oxide-semiconductor (CMOS) fabrication and design technology. As is well known, CMOS integrated circuits are able to operate with extremely low active power requirements; in the case of CMOS memory devices, such as static random access memories (SRAMs), the power requirements for data retention are especially low. These low power requirements allow operation and data retention in electronic systems to be powered by conventional lithium batteries and other cell types, improving the portability and reliability of modern electronic systems.

It has therefore become desirable to provide a battery with an integrated circuit in a single package, so that battery backup functionality may be easily implemented in the system. Copending U.S. patent application Ser. No. 07/995,665, filed Dec. 21, 1992 and entitled "Surface Mountable Integrated Circuit Package with Integrated Battery Mount", assigned to SGS-Thomson Microelectronics, Inc. and incorporated herein by this reference, describes an example of packages containing both a semiconductor integrated circuit and a battery, for use in surface mount applications.

As described in this application, conventional batteries are unable to reliably withstand the temperatures and chemical conditions to which an integrated circuit is subjected during surface mount assembly, however. For example, some types of batteries can be irreparably damaged by exposure to temperatures as low as 181° C., which is below the temperature of certain solders used in the surface mount process. Other components, such as quartz crystal resonators used in connection with on-chip oscillators, are also vulnerable to these harsh environmental conditions. The harsh chemical environment of the surface mount process can also damage the physical construction of these components.

By way of further background, copending U.S. patent application Ser. No. 08/105,301, filed Aug. 11, 1993 and entitled "Molded Package Integrated Circuit with Electrochemical Cell", assigned to SGS-Thomson Microelectronics, Inc. and incorporated herein by this reference, describes an example of a molded integrated circuit package having a battery molded therein.

It is therefore an object of this invention to provide a surface mountable integrated circuit package adapted to receive a module containing temperature-sensitive components, where the module can be readily attached after surface mount of the integrated circuit package.

It is a further object of the present invention to provide such a package where the module is removable for replacement during system life.

It is a further object of the present invention to provide such a package where the module contains a battery.

It is a further object of the present invention to provide such a package where the module can only be assembled in one orientation to prevent misassembly.

It is a further object of the present invention to provide an integrated circuit package with battery-power in which the battery may be replaced for environmentally-sound disposal.

By way of further background, certain system applications install circuit boards with close spacing relative to one another. As a result, the height of components when installed on the circuit board must be kept very low. Despite the height limitations, these circuit boards still require efficient use of their surface area, so that the "footprint" of the integrated circuit packages mounted thereon must also be minimized.

It is therefore a further object of the present invention to provide surface mountable integrated circuit package adapted to receive a module containing temperature-sensitive components, where the module can be readily attached after surface mount of the integrated circuit package, and in which the height of the package with module is minimized.

It is a further object of the present invention to provide such an integrated circuit package which does not have an increased footprint while still reducing the package and module height.

Other objects and advantages will be apparent to those of ordinary skill in the art having reference to this specification in combination with the drawings.

SUMMARY OF THE INVENTION

The invention may be implemented into an integrated circuit package of the surface mountable type which includes a surface mountable chip package and a module containing temperature-sensitive components such as a battery. The molded chip package has conventional surface mountable leads for power and signal connections to a circuit board, and further includes terminals to which the module may connect. The module is preferably constructed to be removable to allow for repair and replacement, and preferably includes molded portions that mate with the chip package. The module and chip package also preferably have lockout features to prevent misorientation of the module relative to the chip package during assembly.

According to another aspect of the invention, the module allows for one or more of the temperature-sensitive components therewithin to be placed outside of the lateral dimensions of the chip package, so that the components do not add significantly to the height of the package. Clearance is provided between the plane of the surface mountable leads and the bottom of the module, so that the board surface area required for the combination module and chip package is not increased.

BRIEF DESCRIPTION OF THE DRAWINGS

FIG. 3a is a plan view, and FIGS. 3b and 3c are elevation views, of a surface-mountable chip package according to the second embodiment of the invention.

FIG. 4 is an elevation view of a pin-and-socket electrical connector used to electrically connect the module to the chip package in the preferred embodiments of the invention.

FIG. 5 is a detailed elevation view of a portion of the modular integrated circuit package of FIG. 2, illustrating the snap-locking of the module to the chip package.

FIGS. 6c and 6e are cross-sectional views, of the base plate of FIG. 6a.

FIG. 8 is a perspective view of the cover for the base plate of FIG. 7c according to the second embodiment of the invention.

FIG. 9 is an exploded perspective view of the base plate of FIG. 7c in combination with the cover of FIG. 8, illustrating their interrelationship when assembled.

FIG. 11b is a plan view of the module and components of the embodiment of FIG. 11a.

DETAILED DESCRIPTION OF THE PREFERRED EMBODIMENTS

Figure 1:
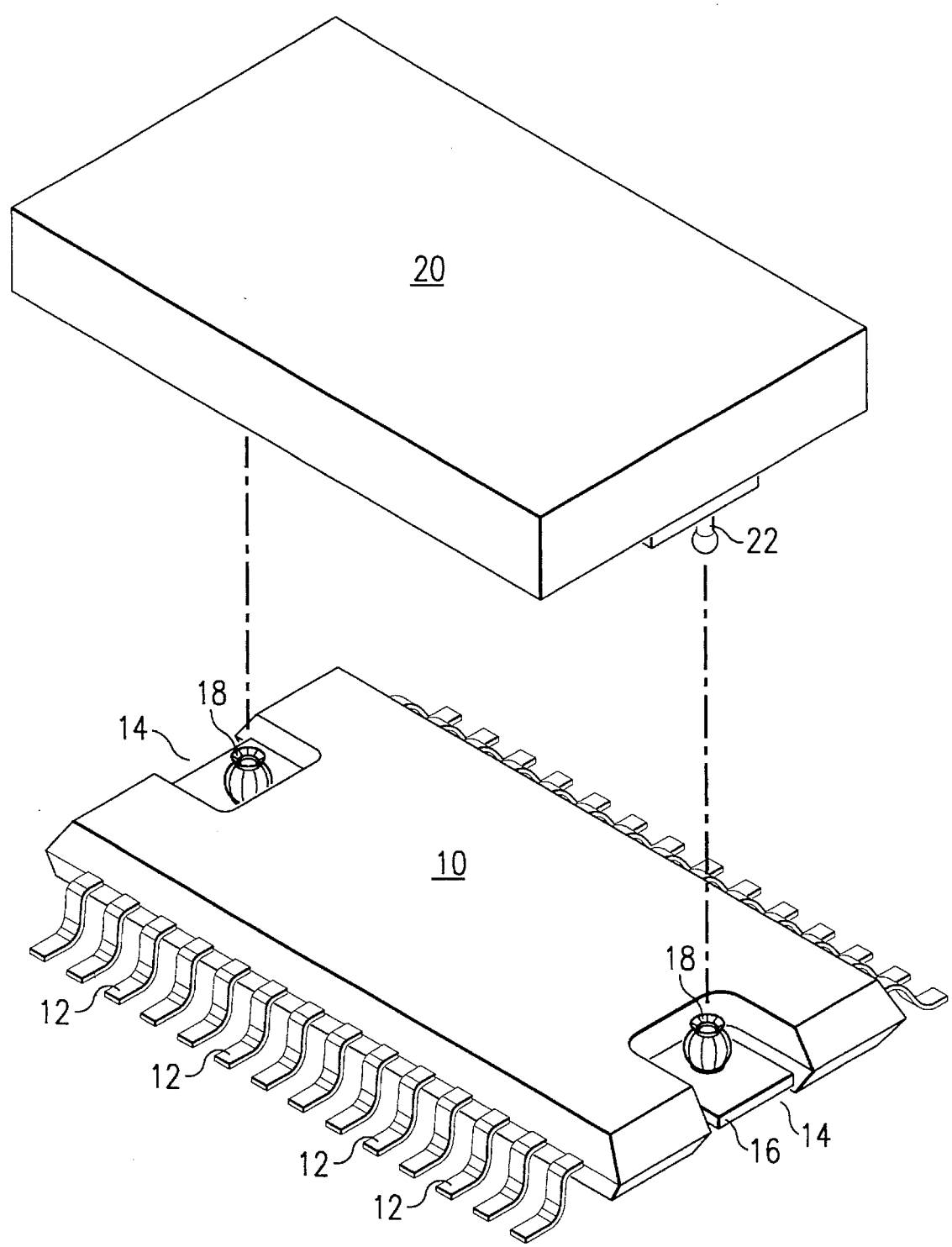
FIG. 1 is an exploded perspective view of a modular integrated circuit package according to a first embodiment of the invention.

Referring to FIG. 1, a first embodiment of the present invention will now be described in detail. The modular integrated circuit package system according to this embodiment of the invention includes molded chip package 10 having leads 12 which are fashioned so as to be surface mountable to a printed circuit board, in the well known manner. Leads 12 may alternatively be formed into the well-known J-lead configuration. Further in the alternative, while chip package 10 of this embodiment is preferably of the molded plastic type to achieve for low cost and ease of manufacture, it is contemplated that the present invention is also applicable to systems where the chip package is of the ceramic hermetically sealed type. Of course, a semiconductor integrated circuit device (not shown) is mounted within chip package 10, and electrical connection made between leads 12 and bond pads on the device by way of wires, beams or other conventional conductive members.

Chip package 10 according to this embodiment of the invention includes cutouts 14 from its body, one located on each end of package 10. In this example, in order to maintain minimal device footprint, cutouts 14 are formed into the rectangular body of package 10; it is contemplated that this placement of cutouts 14 will generally not impact the placement of the semiconductor device within package 10, considering that package 10 is much longer than it is wide and that the integrated circuit chip mounted within package 10 will seldom extend fully to the ends of package 10. Conductive tabs 16 extend into cutouts 14 on each end of package, and are preferably an extension of the lead frame within package 10. In the example of FIG. 1, each conductive tab 16 has female connector 18 mounted thereto.

The system of FIG. 1 further includes module 20 adapted to be mounted physically and electrically to chip package 10. One or more components that are sensitive to solder temperature or to harsh chemical environments, such as electrochemical cells, crystal resonators, and the like, are contained within module 20. As is known in the art, electrochemical cells are now commonly used to provide battery backup power to an integrated circuit, and crystal resonators are often used to set a stable frequency reference for an on-chip oscillator circuit. Pin connectors 22 extend from the bottom ends of module 20 at locations that match the location of female connectors 18 of chip package 10. In this example, only two connector pairs 18, 22 are provided; as such, module 20 is particularly suited to house a single component, such as a battery or a crystal resonator, that is vulnerable to high temperatures or harsh chemicals.

Accordingly, the modular nature of the present invention and the renewable connection between connectors 18, 22, enable module 20 and its contents to be removed from chip package 10. It is contemplated that, in the usual manufacture of a circuit board housing the system of FIG. 1, chip package 10 will first be mounted to the circuit board by wave solder, or another conventional method. Module 20 and its contents may then be mounted to chip package 10 by forcing pin connectors 22 of module 20 into female connectors 18 of chip package 10.

According to the present invention, module 20 and its contents are not exposed to the solder, flux, solvents and temperature extremes to which chip package 10 is subjected in the surface mount process. As a result, the reliability of the contents of module 20 will not be degraded by the surface mount process.

In addition, module 20 may be readily replaced merely by pulling module 20 from chip package 10 to disengage pin connectors 22 from female connectors 18, without requiring removal of chip package 10 from the circuit board. In the case where module 20 contains a battery, the ability to remove module 20 facilitates replacement of the battery upon the end of its useful life. The present invention also facilitates proper disposal of the used battery, as only module 20 need be disposed of, rather than the entire integrated circuit including the package body, leads and lead frame, and the like. Module 20 may also be removed in the case where the circuit board must again be subjected to wave solder and other processes (e.g., in a manufacturing rework).

Figure 2:
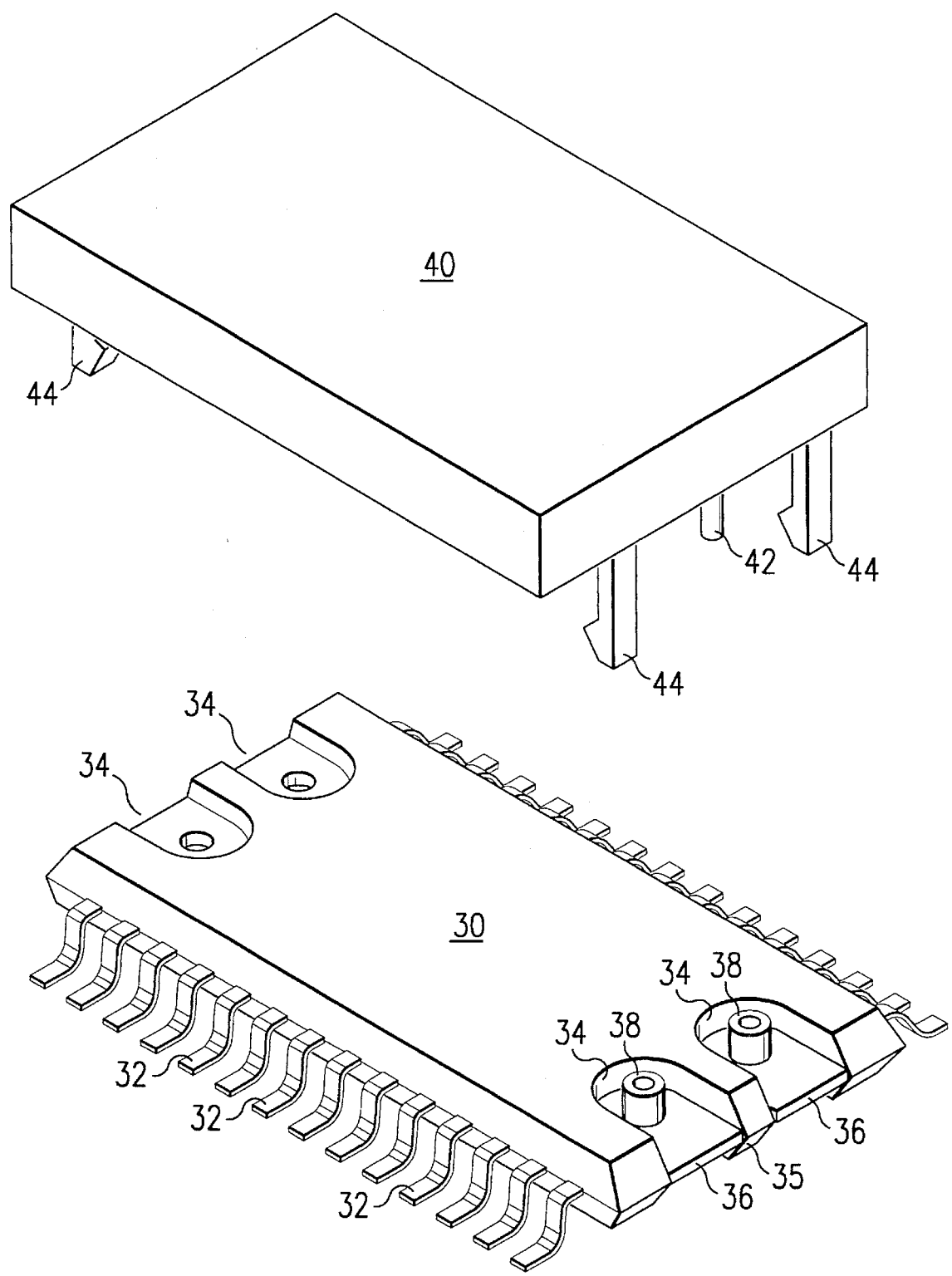
FIG. 2 is an exploded perspective view of a modular integrated circuit package according to a second embodiment of the invention.

Referring now to FIG. 2, a second embodiment of the present invention will now be described in detail. This embodiment of the invention includes chip package 30 and module 40, with four renewable electrical connections therebetween. These four connections enable module 40 to house both a electrochemical cell for chip backup power, and also a crystal resonator for setting the frequency of an oscillator circuit in the semiconductor device within chip package 30. Examples of integrated circuits that may use both of these components include timekeeper circuits, and clocked logic devices based on a steady clock frequency input.

As before, chip package 30 has leads 32 extending from its sides, and which are formed in the conventional manner so as to be surface-mountable to a circuit board; alternatively, leads 32 may be formed in the conventional J-lead manner. Wires (not shown) electrically connect leads 32 to corresponding terminals on the semiconductor device (not shown) packaged within chip package 30. The molded body of chip package 30 has four sculpted cutouts 34, two each located at each end of chip package 30, and each which formed during the molding of the body of chip package 30. Conductive tabs 36 extend from the lead frame of chip package 30 into each of cutouts 34, into which female connectors 38 are mounted as shown.

Module 40, including a electrochemical cell and a crystal resonator as noted above, has four pin connectors 42 (three of which are not shown in FIG. 2) extending from the bottom surface thereof at locations corresponding to the location of female connectors 38 of chip package 30. In addition to the mechanical connection provided by the electrical connectors 38, 42, module 40 according to this embodiment of the invention includes four snap members 44 extending from its bottom surface. Snap members 44 snap over chip package 30 when module 40 is mounted thereto, to provide secure mechanical mounting beyond that provided by electrical connectors 38, 42. The preferred construction of snap members 44 and their mating locations on chip package 30 will be described in further detail hereinbelow relative to FIG. 5.

FIGS. 3a through 3c illustrate various views of chip package 30 prior to the installation of female connectors 38, and prior to its mounting to the circuit board. Referring to FIG. 3a, conductive tabs 36 extend from the package lead frame into each of cutouts 34; each conductive tab 36 has a hole therethrough into which female connector 38 (shown in detail in FIG. 4) may be mounted. In this example, each female connector 38 is press-fit in the conventional manner into the hole in each of conductive tabs 36. Alternatively female connectors 38 may be soldered, welded, swaged or screwed into their respective conductive tabs 36.

While connectors of the pin-and-socket type are utilized according to this embodiment of the invention, conventional connectors of other types may alternatively be used. For example, conductive tabs 36 may be solid planar surfaces, in which case the mating connector of module 40 would be of the spring type. Conventional snap connectors, as well as miniature connectors of other known types, may alternatively be used.

Considering that four terminals are provided, it is preferable to include a lock-out feature such that module 40 may not be installed in the wrong physical orientation relative to chip package 30 (i.e., 180° from the proper orientation), which would, of course, result in incorrect electrical connection. Referring to FIGS. 3a and 3b, chip package 30 includes lockout tab 35 as part of its molded body, which extends between two cutouts 34 on one end of chip package 30. The other end of chip package 30 has an open gap 37 between its two cutouts 34, with no molded tab thereat. This construction of chip package 30 provides a lockout feature when module 40 has a cooperatively placed leg member that extends into gap 37 when properly mounted. This leg member will impact lockout tab 35 if module 40 is oriented improperly, which will prevent the improper mounting of module 40 to chip package 30. FIG. 3c also illustrates the presence of lockout tab 35 at one end of chip package 30, and the absence of a tab (i.e., gap 37) at the other end.

FIGS. 3a and 3c also illustrate sloped end portions, or lead-ins, 31 at the four corners of chip package 30. Sloped lead-ins 31 facilitate the mounting of module 40 to chip package 30, in this example, by providing a slope to snap members 44. The interaction between snap members 44 and the mating portions of chip package 30 will now be described relative to the illustration of FIG. 5, which shows the positional relationship of snap members 44 over chip package 30 when mounting is completed.

Each snap member 44 includes a surface 41 that is sloped toward the interior. Sloped surface 41 on snap member 44 cooperates with sloped lead-in surface 31 on chip package 30 during mounting, so that downward pressure on module 40 flexes snap member 44 outside of the edge of chip package 30. Once module 40 is pushed downwardly beyond the point where snap member 44 has fully flexed outside of chip package 30 (i.e., when surfaces 31, 41 are no longer in contact), snap member 44 returns to its unflexed position, at which point its sloped surface 43 mates snugly with sloped surface 33 of chip package 30. This construction also provides an audible snapping sound to indicate to the human installer that secure mechanical connection has been achieved. Once installed in such a manner that snap members 44 are secure about chip package 30 as shown in FIG. 5, module 40 cannot detach from chip package 30 without an upward force sufficient to flex snap members 44 around the edge of chip package 30.

According to this embodiment of the invention, therefore, snap members 44 and their mating surfaces on chip package 30 provide mechanical security to the electrical connection between module 40 and chip package 30, reducing the likelihood of inadvertent disconnection. Audible feedback of the secure connection is also provided to reduce the likelihood of improper installation.

Referring now to FIG. 9, the construction of module 40, including a base plate 50 and a cover 45 according to this embodiment of the invention, will now be described. Each of base plate 50 and cover 45 are preferably formed of molded thermoplastic, or of another conventional plastic. Base plate 50 includes the mounting supports for both battery, or electrochemical cell, 60 and also a crystal resonator (not shown), and provides structural support for pin connectors 42 and snap members 44. Cover 45 fits over base plate 50 to provide mechanical and environmental protection for the components, and retains potting compound inserted into module 40 through a hole (not visible in FIG. 9) in the bottom of base plate 50. Alternatively, potting compound may be placed into the interior of cover 45, with base plate 50 then pressed into the filled cover 45.

The detailed construction of base plate 50 will now be described in detail relative to FIGS. 6a through 6e, after installation of pin connectors 42. Pin connectors 42c are those associated with the crystal resonator, while pin connectors 42+, 42− are associated with the positive and negative terminals of the electrochemical cell, respectively.

Figure 6A:
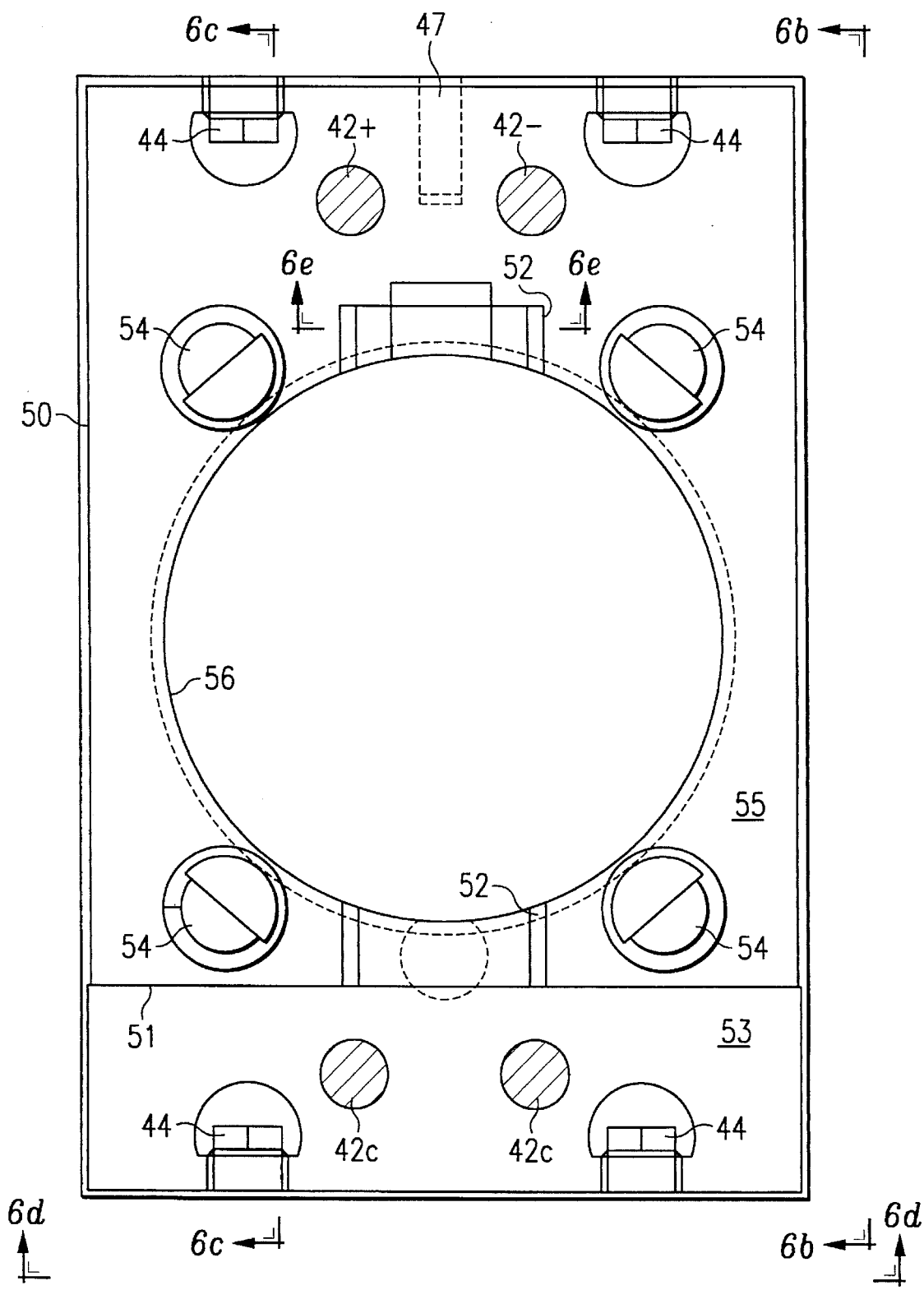
FIG. 6a is a plan view of a base plate for a module for packaging temperature sensitive components according to the second embodiment of the invention.

As noted above, base plate 50 is preferably formed as a unitary molded plastic body. As shown in FIG. 6a, base plate 50 has a circular hole therethrough defined by edges 56, to allow injection of potting compound after placement of the electrochemical cell and crystal resonator. Base plate 50 has two major horizontal surfaces 53, 55, defined relative to one another by vertical drop 51, to accommodate the electrochemical cell to be placed vertically above the crystal resonator. As will be described hereinbelow, the different vertical positions of surfaces 53, 55 will cooperate with positioning features in cover 45 to ensure proper orientation and secure positioning of cover 45 over base plate 50.

Battery mounts 54 extend upwardly from upper surface 55 of base plate 50 to provide a secure position for the mounting of the electrochemical cell. In this example, battery mounts 54 are each frustoconical in shape, with a lower horizontal truncating surface on the side facing the hole defined by edge 56 to hold the electrochemical cell; the higher horizontal truncating surface of battery mount 54 is positioned radially outward from the holding surface to provide fixed lateral positioning of the cell.

Figure 6B:
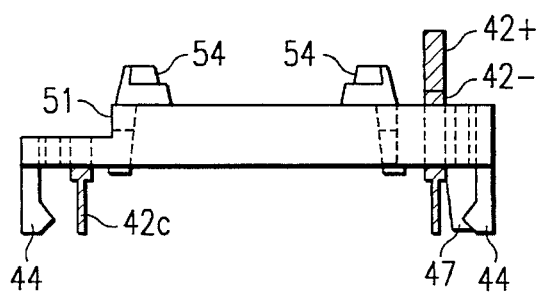
FIGS. 6b and 6d are elevation views.
Figure 6C:
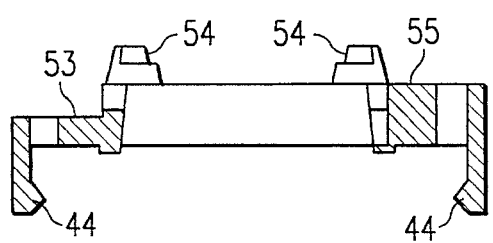
Figure 6D:
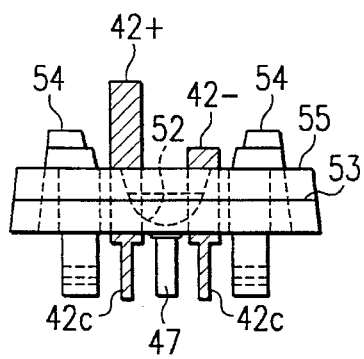
Figure 6E:
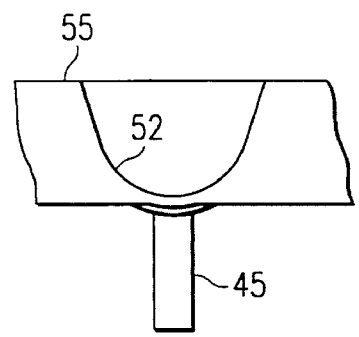

As shown in FIGS. 6a, 6d, and 6e, base plate 50 includes a semi-cylindrical cutout portion extending below surface 55 and defined by surface 52. This cutout portion defined by surface 52 receives and supports the crystal resonator so that it is disposed beneath the electrochemical cell when both are mounted to base plate 50.

Snap members 44, constructed with the shape described above relative to FIG. 5, extend from the bottom surface of the ends of base plate 50. Lockout tab 47 extends from the bottom surface of base plate 50 at a location between battery pin connectors 42+, 42−, for mating with gap 37 of chip package 30 (shown in FIG. 3a). As shown in FIGS. 6a and 6b, no lockout tab extends from beneath the end of base plate 50 at which crystal pin connectors 42c are located; the absence of a lockout tab at this end mates with lockout tab 35 of chip package 30 (as shown in FIG. 3a). Accordingly, lockout tabs 35, 47 ensure proper electrical connection between the crystal resonator and electrochemical cell of module 40, on the one hand, and the appropriate terminals of the integrated circuit within chip package 30, on the other hand. Misorientation of module 30, and the possibility of severe electrical damage, is thus prevented.

In this example, as is evident from FIG. 6a, pin connectors 42 are of circular cross-section, and have a portion that mates with corresponding holes in base plate 50 so as to be press-fit thereinto. An example of the construction of pin connectors 42 is illustrated in FIG. 4, where narrow diameter pin 42p is the portion which will mate with female connector 38. Shoulder portion 42a fixes the position of pin connector 42 when installed into base plate 50 from beneath, such that the top surface of shoulder portion 42a abuts against the bottom of base plate 50; the bottom surface of shoulder portion 42a fixes the position of pin connector 42 when installed into female connector 38. Shank portion 42s extends into and through base plate 50 to the desired height above base plate 50. As shown in FIGS. 6b and 6d, the tops of pin connectors 42c are substantially flush with, or extend slightly above (to facilitate welding), surface 53 of base plate 50. Pin connector 42− extends above surface 55 of base plate 50 to a height corresponding to the holding surface of battery mounts 42, and pin connector 42+ extends above surface 55 of base plate 50 to a height corresponding to the thickness of the cell above the holding surface of battery mounts 42.

Figure 7A:
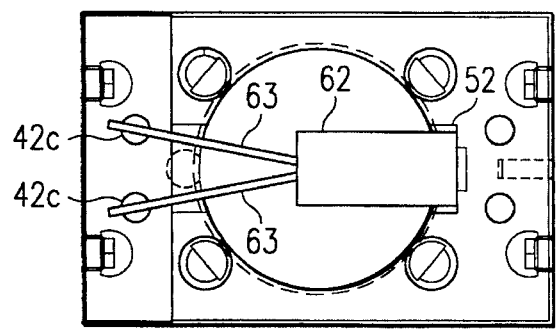
FIGS. 7a and 7b are plan views of the base plate of FIG. 6a according to the second embodiment of the invention, and illustrating steps in the assembly of the temperature sensitive components thereinto.
Figure 7B:
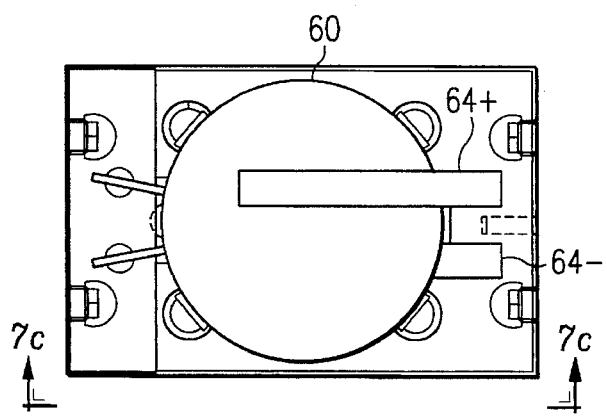
Figure 7C:
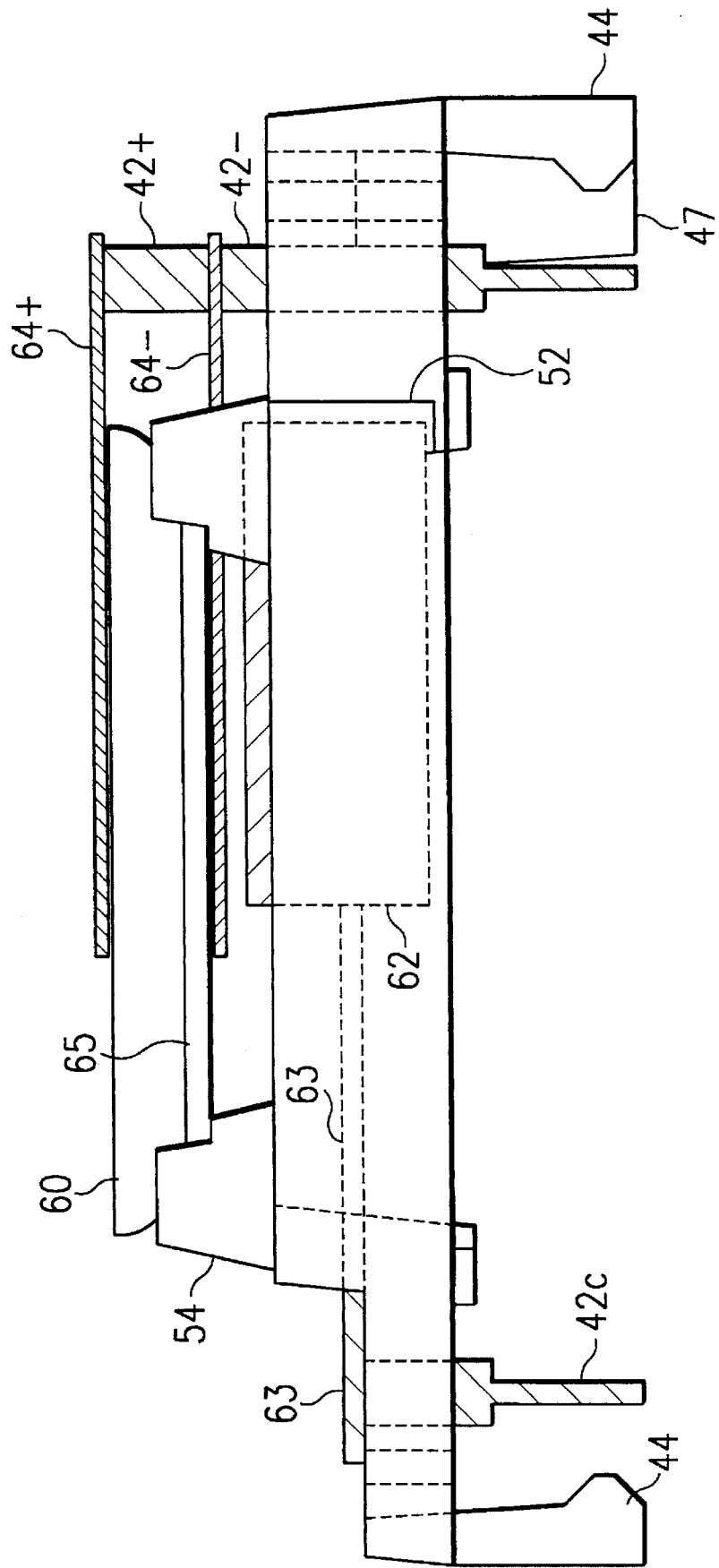
FIG. 7c is an elevation view of the base plate of FIG. 7b, illustrating the location of the temperature sensitive components assembled thereinto.

Referring now to FIGS. 7a through 7c, the installation of the components to base plate 50 according to this embodiment of the invention will now be described. FIG. 7a illustrates, in plan view, crystal resonator 62 installed within the semicylindrical cutout defined by edge 52 in base plate 50. Crystal resonator 62 is preferably of the conventional quartz type, hermetically sealed in a cylindrical metal package with two wires 63 extending from one end. Crystal resonator 62 is assembled into base plate 50 by placing it in the cutout defined by edge 52, and by fastening wires 63 to pin connectors 42c according to conventional techniques such as ultrasonic or thermocompression bonding, or spot welding.

After installation of crystal resonator 62, battery 60 with pre-attached tab leads 64 is installed into base plate 50 as shown in FIG. 7b. Tab leads 64+, 64− are preferably pre-welded to the positive and negative terminal sides of cell 60, respectively, for ease of manufacture. Tab lead 64+ is then fastened to the end of pin connector 42+, and tab lead 64− is fastened to the end of pin connector 42−, each by way of welding or another conventional technique. As shown in FIGS. 7b and 7c, the tops of pin connectors 42+, 42− are at different heights, in order to simplify the design of tab leads 64 and also their attachment to pin connectors 42.

FIGS. 7b and 7c illustrate base plate 50 after the installation of electrochemical cell 60. Electrochemical cell 60 is preferably of the lithium type, due to its high energy density. In this embodiment of the invention, cell 60 is of the disk shape, with opposing sides of its case serving as positive and negative electrical terminals, and is physically supported by the holding surfaces of battery mounts 54. The orientation of electrochemical cell 60 in this embodiment of the invention, with the positive terminal above the negative terminal, is preferred from a reliability standpoint, because potting compound will be inserted through the hole in the bottom surface of base plate 50. This orientation of electrochemical cell 60 ensures that its seal 65 will directly receive and be fully encapsulated by the potting compound. Alternatively, the physical orientation of electrochemical cell 60 may be reversed from that shown in FIG. 7c, in which case the flow of potting compound over seal 65 would be indirect.

After assembly of cell 60 and crystal resonator 62 into base plate 50 as shown in FIGS. 7b and 7c, cover 45 may be installed. Cover 45 is also preferably a unitary molded plastic body, having the structural shape and features described herein. Referring to FIG. 8, the interior of cover 45 is illustrated, showing molded protrusions 48, 49 on its inner surfaces, to provide secure seating of cover 45 upon base plate 50. As is evident from FIG. 8, protrusions 49 are longer (i.e., extend further toward the bottom) than protrusions 48, to account for the different heights of horizontal surfaces 53, 55 of base plate 50. Cover 45 thus mates with base plate 50 in a secure and stable manner and, to the extent that cover 45 has physical polarity, the cooperation of protrusions 48, 49 with surfaces 53, 55 of base plate 50 will ensure the proper orientation of cover 45. FIG. 9 illustrates, in exploded view, the installation of cover 45 over base plate 50 in the proper orientation.

Cover 45 may be epoxied to base plate 50, if desired; alternatively, cover 45 may snugly fit over base plate 50. The construction of module 40 may then be completed by the injection of conventional potting compound (not shown) through the hole in the bottom of base plate 50. The injection of potting compound will provide thermal and environmental insulation of cell 60 and crystal 62, as well as reliably fix the mechanical placement of these components within module 40. As noted above, potting compound may be alternatively be placed into the interior of cover 45, with base plate 50 then pressed into the filled cover 45 to secure the components therein.

Upon completion of module 40 as shown in FIG. 9, and upon the surface mounting of chip package 30 at the desired location of the printed circuit board, module 40 may be installed onto chip package 30 in the manner described hereinabove relative to FIGS. 2 and 5. As noted above, the provision of lockout tab 35 on chip package 30 and lockout tab 47 on module 40 prevents the misorientation of module 40 relative to chip package 30. Proper electrical connection of the components in module 40 to the proper terminals of the integrated circuit housed in chip package 30 is thus ensured.

This embodiment of the invention provides the same advantages as discussed above relative to the embodiment of the invention described relative to FIG. 1, including the ability to surface mount the integrated circuit chip to a printed circuit board without exposing fragile components to the harsh temperatures and chemicals of the surface mount process, and also including the ability to remove the components to rework the printed circuit board or to replace the components. The embodiment of the invention described relative to FIGS. 2 through 9 provides the additional advantages of secure mechanical connection of module 40 to chip package 30, provided by snap members 44 and their mating surfaces on chip package 30, and also an audible signal indicating the proper seating of module 40.

Figure 10A:
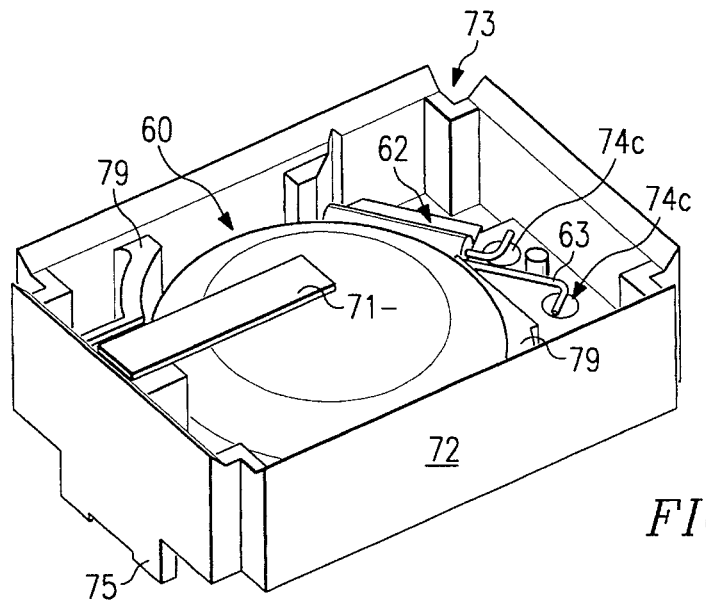
FIGS. 10a through 10e are perspective views of a module according to a third embodiment of the invention.
Figure 10B:
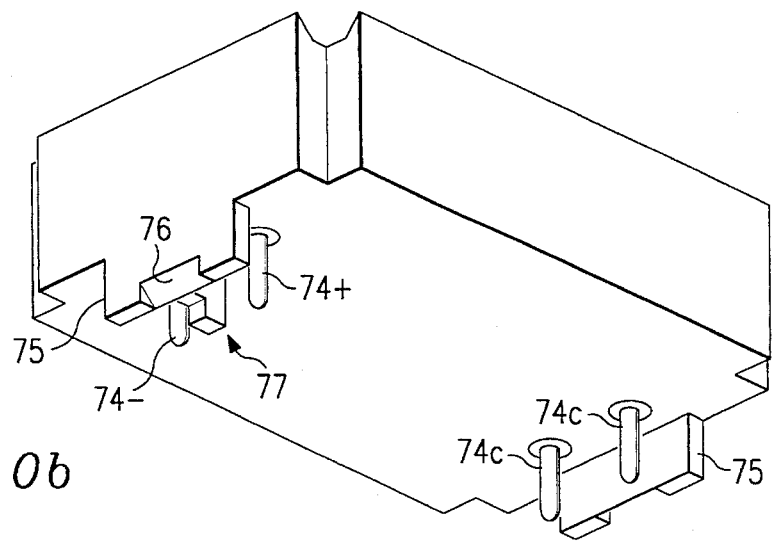
Figure 10C:
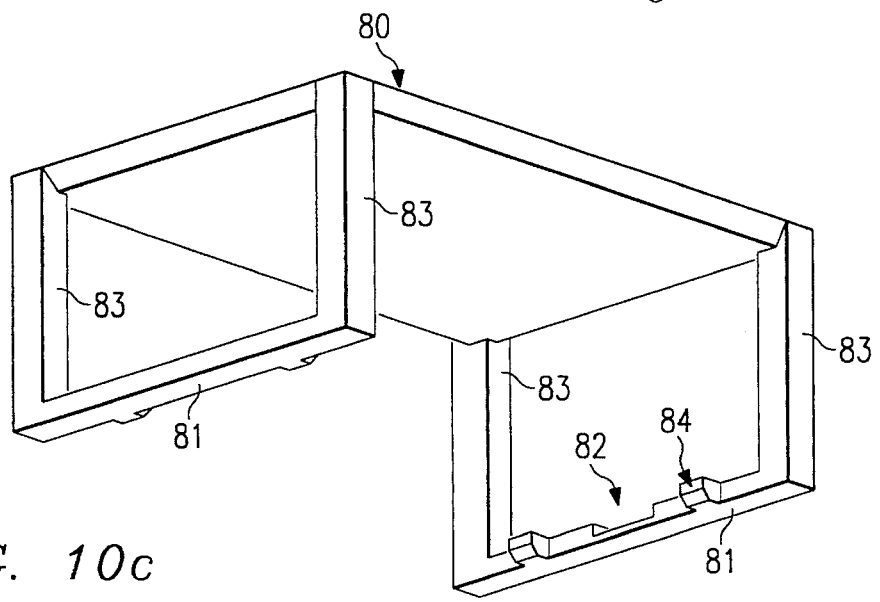
Figure 10D:
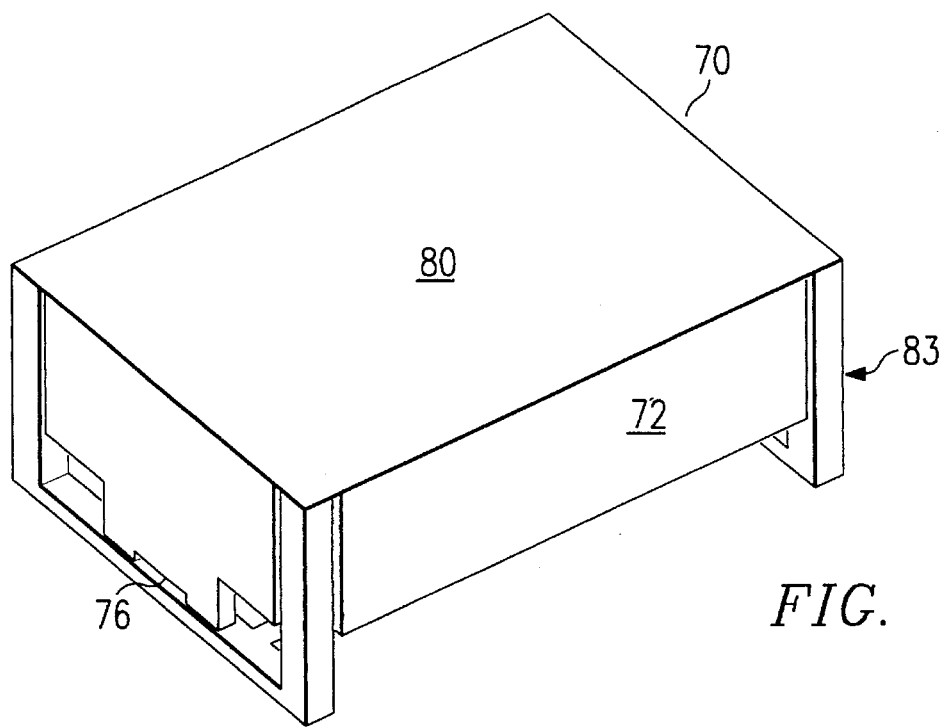
Figure 10E:
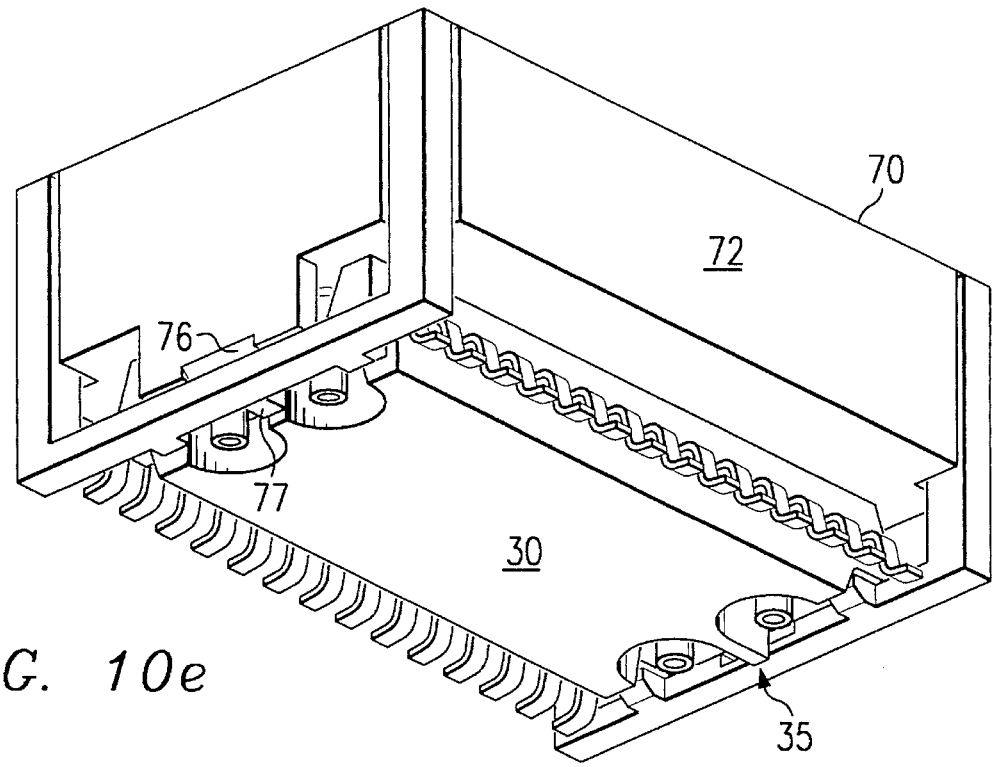

Referring now to FIGS. 10a through 10e, another embodiment of the present invention will now be described. According to this embodiment of the invention, as illustrated in FIG. 10e, module 70, including an electrochemical cell 60 and crystal resonator 62 as before, may be secured to a similar chip package 30 as described hereinabove. According to this embodiment of the invention, module 70 is of two-piece construction, having tub 72 and baled cover 80, which will each now be described in detail.

FIGS. 10a and 10b illustrate tub 72, which is a unitary molded plastic body having a closed bottom surface and sidewalls, and within which cell 60 and crystal resonator 62 are disposed. Tub 72 includes pin connectors 74c for connection to crystal resonator wires 63 within tub 72, and for connection to female connectors 38 on chip package 30 (FIG. 2) in similar manner as described above. Tub 72 further includes lead tabs 71+ (not shown) and 71– for electrical connection to cell 60, and which are connected to their respective pin connectors 74+, 74–. In this example, the negative terminal side of cell 60 is oriented upwardly, so that seal 65 of cell 60 will directly receive potting compound introduced from the top of tub 72. Walls 79 are provided in the interior of tub 72 to define the location of cell 60.

On its bottom surface, tub 72 has molded extensions 75, each with slot 76 formed into its outer surface. Slots 76 facilitate removal of module 70 from chip package 30, as necessary to rework of the printed circuit board to which chip package 30 is attached, and to replace cell 60 at the end of its useful life. Tub 72 also has, on its bottom surface, molded lockout tab 77 which cooperates with an opening in chip package 30 in similar fashion as lockout tab 47 described hereinabove relative to the embodiment of FIGS. 2 through 9, to ensure proper orientation of module 70 when mounted onto chip package 30. The corners of tub 72 have grooves 73 to receive corresponding portions of cover 80, which will now be described in detail relative to FIG. 10c.

Cover 80 is preferably a unitary molded plastic body having a planar top surface that fits flushly within the bevel of the top edge of tub 72. A bale is provided at each end of cover 80, consisting of a pair of legs 83 connected to a bottom rail 81. Legs 83 are shaped so as to fit grooves 73 in tub 72. Disposed on the inner surface of each of bottom rails 81 are two snap members 84 which engage surfaces on chip package 30 when module 70 is disposed thereover, so as to mechanically lock module 70 thereto. Each of bottom rails 81 also have a notch 82 near its center which aligns with corresponding notch 76 on tub 72, to facilitate removal of module 70 from chip package 30.

After the installation and connection of cell 60 and crystal resonator 62 and the subsequent introduction of potting compound into the interior of tub 72, cover 80 is placed over tub 72 in the manner shown in FIG. 10d. Legs 83 of cover 80 are disposed within grooves 73 of tub 72, so that the projection 75 on each end of tub 72 abuts a corresponding top surface of the bottom rail 81 of cover 80, completing module 70 as shown in FIG. 10d. After surface mounting of chip package 30 onto the printed circuit board, module 70 may then be installed onto chip package 30 by insertion of pin connectors 74 of tub 72 into female connectors 38 of chip package 30, with lockout tab 77 of tub 72 fitting into gap 37 on one end of chip package 30, and with lockout tab 35 of chip package 30 fitting into a gap between pin connectors 74c on the other end of tub 72. Application of a downward force onto module 70 will cause flexure of snap members 84 around the end edges of chip package 30, resulting in the assembled combination of FIG. 10e in place on the circuit board. It should be noted that the view of FIG. 10e is merely for purposes of explanation, and is not intended to be an actual construction, as module 70 will generally only be installed after the surface mounting of chip package 30 to a circuit board.

Removal of module 70 from chip package 30 mounted to the circuit board, may be readily accomplished by insertion of a slotted screwdriver or similar tool into slot 76 on an end of module 70 and the application of an upward force on module 70. Snap members 84 on the lifted end of module 70 will disengage from chip package 30, allowing for removal of pin connectors 74 from female connectors 38 and thus removal of module 70. Replacement of module 70 may then be performed as desired.

Figure 11A:
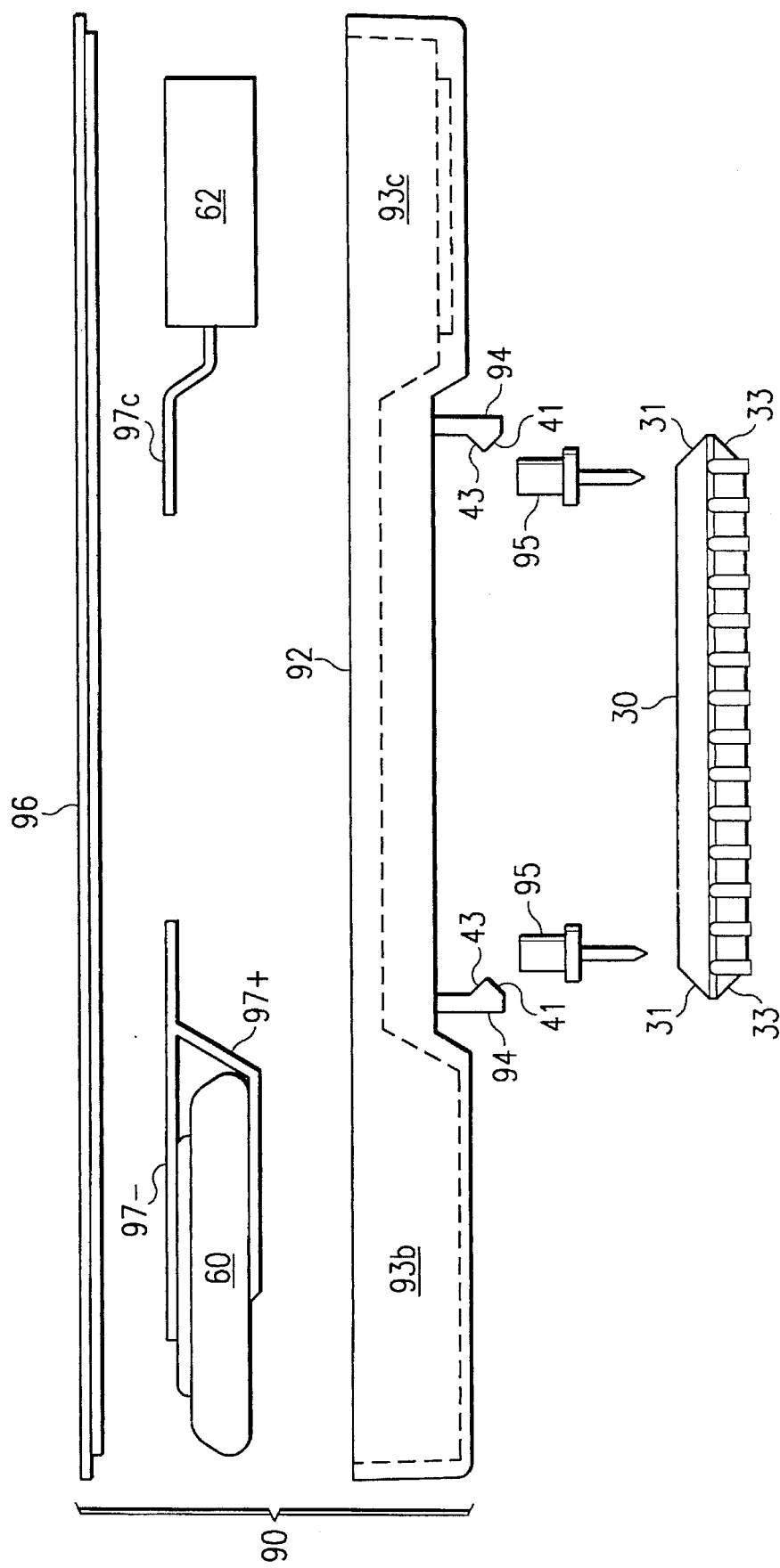
FIG. 11a is an exploded elevation view of a module, chip package and components according to a fourth embodiment of the invention.
Figure 11B:
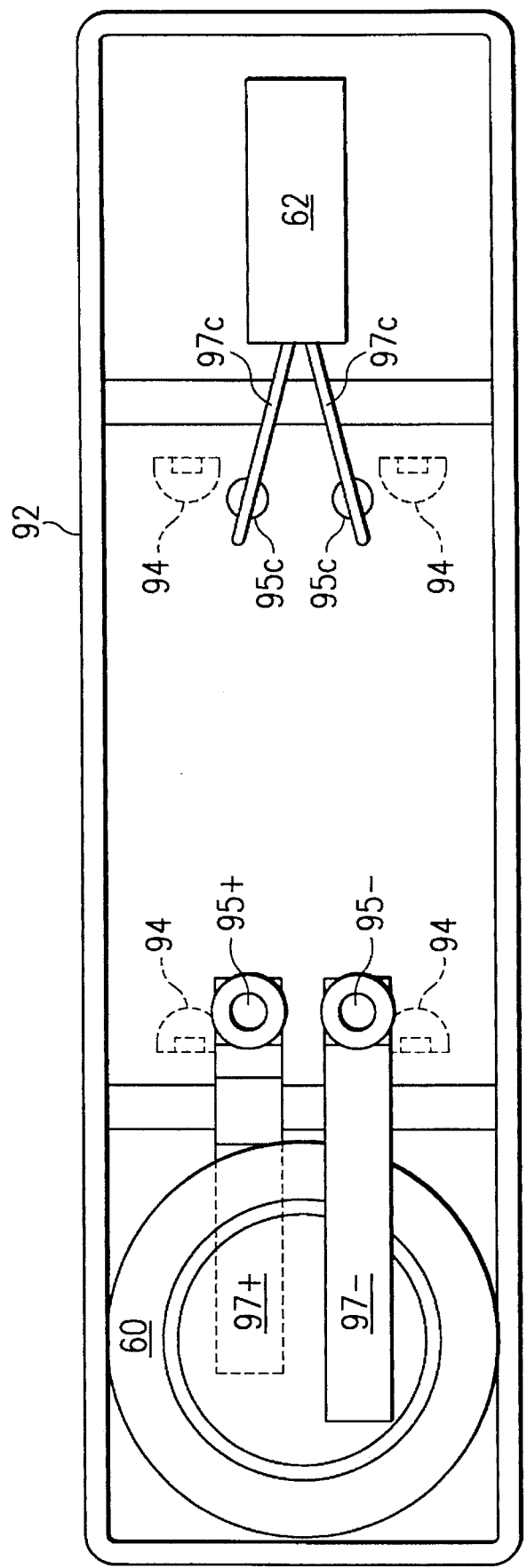

Referring now to FIGS. 11a and 11b, module 90 according to another embodiment of the invention will now be described in detail. As in the case of modules 40, 70 described hereinabove, module 90 is designed to house cell 60 and crystal 62; alternatively, temperature-sensitive components of another type may be housed within module 90. Module 90 includes base 92 within which are formed cavities 93b, 93c to receive cell 60 and crystal 62, respectively. In the embodiment of FIGS. 11a and 11b, however, cell 60 and crystal 62 will not overlie chip package 30 upon installation, but instead will be disposed outside of the outline of chip package 30 and above the plane of the circuit board to which chip package 30 is to be mounted. As a result, the overall height of the system of chip package 30 and module 90 is minimized.

In this embodiment of the invention, and similarly as noted above, the positive and negative terminals of cell 60 are held by tab leads 97+, 97−, respectively. Tab leads 97+, 97− are preferably pre-welded to the positive and negative terminal sides of cell 60, respectively, for ease of manufacture, and are aligned so as to be fastenable to pin connectors 95 in module 90 upon assembly. Similarly, wire leads 97c from crystal 62 extend therefrom, for connection to pin connectors 95 in module 90 upon assembly. Pin connectors 95, as in the embodiments described hereinabove, mate with sockets 38 (not shown in FIGS. 11a and 11b), so that electrical connection is provided between the chip packaged in chip package 30, on the one hand, and cell 60 and crystal 62, on the other hand. FIG. 11b illustrates the arrangement of cell 60 and crystal 62 within cavities 93b, 93c, respectively, of base 92 after their installation, with each of leads 97 welded or otherwise connected to its corresponding pin connector 95.

Module 90 according to this embodiment also includes a lid 96, securable by way of an epoxy over cell 60 and crystal 62 after their assembly therewithin. The primary function of lid 96 is primarily aesthetic, in that it provides a molded flat surface of the desired finish to receive the appropriate marking. Even with the use of lid 96, it is preferred that a potting compound (not shown) be inserted into module 90 prior to the attachment of lid 96 thereto, to provide additional structural strength to module 90 and environmental and mechanical protection to cell 60 and crystal 62. Alternatively, lid 96 may be omitted from module 90, with the potting compound providing the necessary environmental and mechanical protection for cell 60 and crystal 62; elimination of lid 96 will, of course, slightly reduce the overall height of the system of chip package 30 and module 90.

Also according to this embodiment of the invention, base 92 includes four snap members 94 extending from its bottom surface, for mating with the ends of chip package 30 in similar fashion as described above. Each snap member 94 includes an interiorly sloped surface 41 which cooperates with sloped lead-in surface 31 on chip package 30 during mounting. Downward pressure on module 90 will flex snap members 44 outside of the edge of chip package 30, until the sloped surfaces of snap members 94 mate snugly with sloped surfaces 33 of chip package 30, preferably with an audible snapping sound to indicate secure mechanical connection. As in the case of module 40 described above, module 90 cannot detach from chip package 30 after installation without the application of a significant upward force.

Figure 12A:
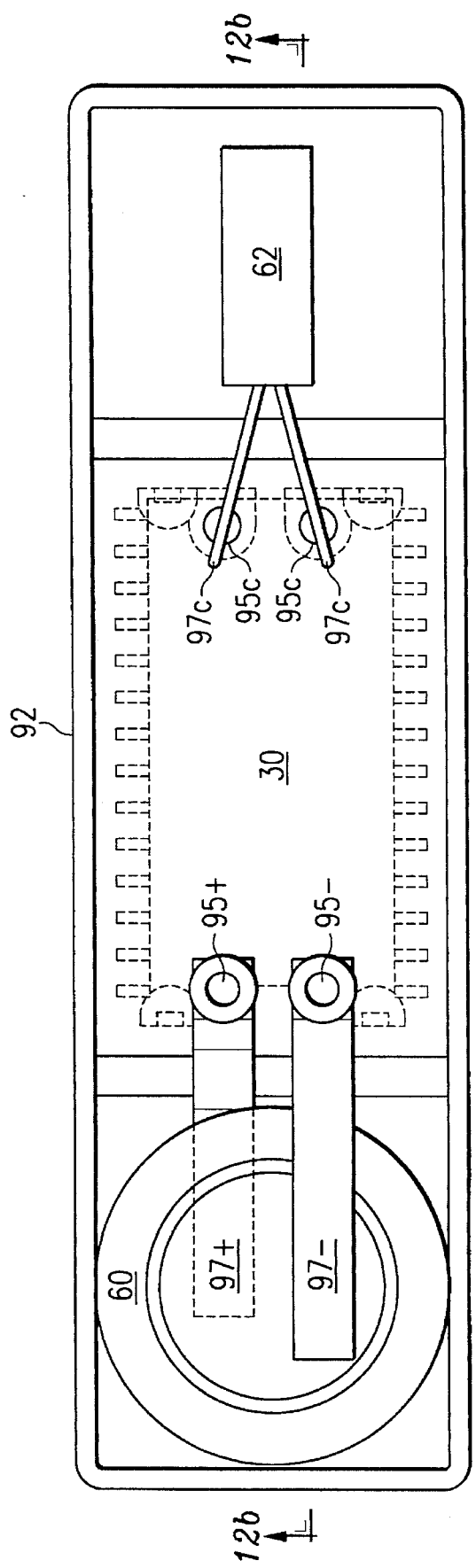
FIGS. 12a and 12b are plan and partial cross-section elevation views, respectively, of the module and chip package of the embodiment of FIGS. 11a and 11b after assembly to the chip package.
Figure 12B:
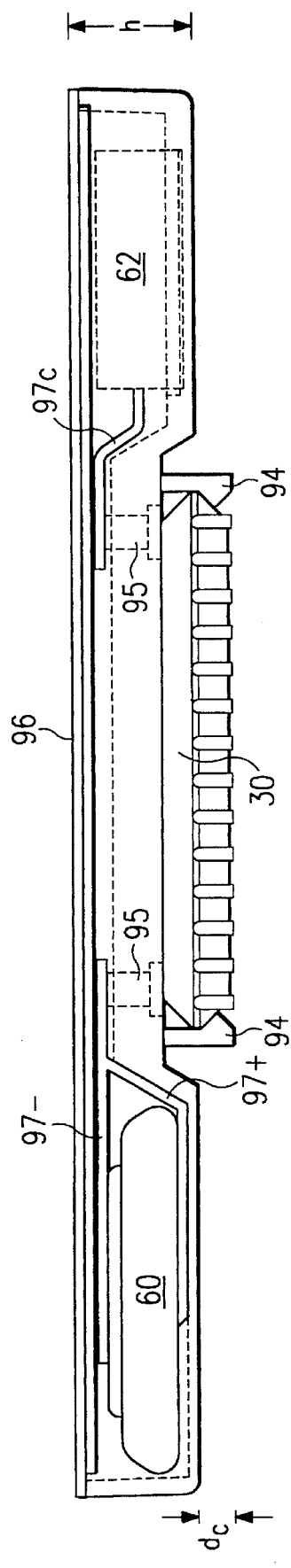

Referring now to FIGS. 12a and 12b, module 90 is illustrated after its attachment to chip package 30. As described above, the attachment of module 90 is preferably performed after chip package 30 is mounted to its circuit board location, so that the temperature-sensitive components (e.g., cell 60 and crystal 62) are not subjected to the high temperatures of the solder reflow surface-mount process.

The attachment of module 90 to chip package 30 may be done, as noted above, merely by inserting pin connectors 95 into their respective sockets in chip package 30 and the application of downward pressure so that snap members 94 snap around and mate with chip package 30.

FIG. 12b illustrates the contents of module 90 in cross-section (with chip package 30 shown in its elevation view). As is evident from FIG. 12b, the overall height of chip package 30 and attached component module 90 is much reduced from that of the described embodiments hereinabove, as cell 60 and crystal 62 are disposed outside of the outline of chip package 30 (see FIG. 12a); neither cell 60 nor crystal 62 are disposed directly above chip package 30. For example, it is contemplated that the overall height h, measured from the bottom of chip package leads 32 to the top of lid 96, may be as low as on the order of 0.215 inches. In addition, as shown in FIG. 12b, the bottom of module 90 away from chip package 30 remains some clearance distance $d_c$ above the plane of chip package leads 32. This clearance distance (for example, on the order of 0.010 to 0.020 inches) allows the placement of conductive traces on the circuit board under the overhanging portion, or "shadow", of module 90. As a result, the height of the package combination is minimized without sacrificing circuit board surface area to accommodate cell 60 and crystal 62.

As is evident from FIGS. 12a and 12b and from the relatively small clearance distance $d_c$, the overhanging shadow of module 90, while allowing for circuit board conductive traces to run thereunder, generally precludes the placement of other components thereunder. As such, module 90 may affect the density of components on the circuit board to which chip package 30 is mounted. According to another alternative embodiment of the invention, as will now be described relative to FIGS. 13a, 13b, 14a and 14b, the height of the package and module system remains minimized with a much reduced "shadow" relative to that of module 90 described hereinabove.

Figure 13A:
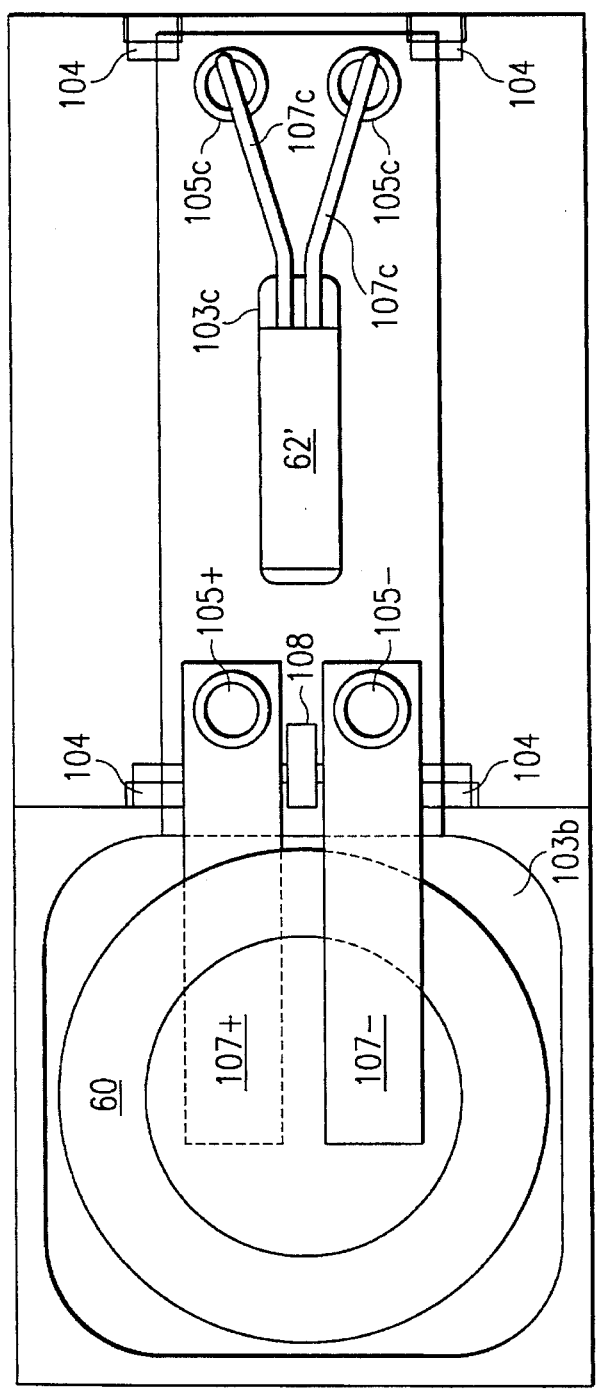
FIGS. 13a and 13b are plan and elevation views, respectively, of a module and components according to a fifth embodiment of the invention.
Figure 13B:
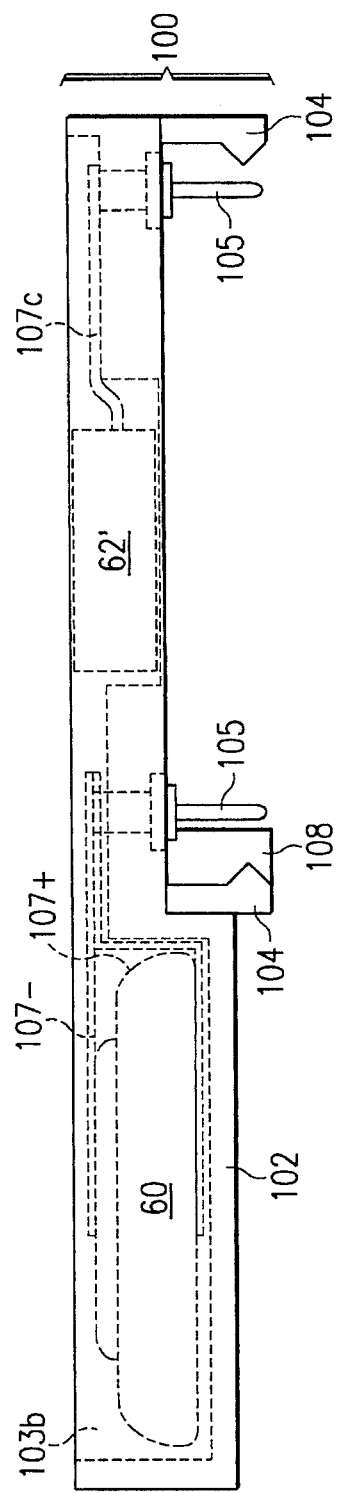

FIGS. 13a and 13b illustrate, in plan and cross-sectional view, the construction of module 100 according to this alternative embodiment of the invention. Module 100 includes base 102, which has a cavity 103b for receiving cell 60 as before. Cavity 103c is provided in base 102 to receive crystal 62', but at a location which will overlie the chip package after assembly. As such, crystal 62' is preferably of a "miniaturized" form, such as the C-002RX model crystals manufactured and sold by Epson; the thickness of such a miniaturized crystal 62' is on the order of 0.080 inches.

As shown in FIG. 13a, cell 60 is retained within pre-welded tab leads 107+, 107−, in contact with the positive and negative terminal sides of cell 60 as before. Tab leads 107+, 107− are welded or otherwise bonded to pin connectors 105+, 105− which will provide electrical connection to the chip package. Crystal 62' is similarly placed within cavity 103c, with its wire leads 107c bonded to pin connectors 105c at the other end of module 100, for electrical connection to the chip package. After installation of cell 60 and crystal 62', potting compound is preferably introduced into base 102 to provide structural strength for module 100, and to provide mechanical and environmental protection for cell 60 and crystal 62'.

As in the case of module 90 discussed above, snap members 104 are provided on the bottom side of base 102 to mate with sloped portions of the chip package in the manner described hereinabove. Also as described above relative to module 70, lockout tab 108 is provided on the underside of module 100 to mate with a gap in the chip package, ensuring that module 100 is installed with pin connectors 105 connected to the appropriate socket terminals.

Figure 14A:
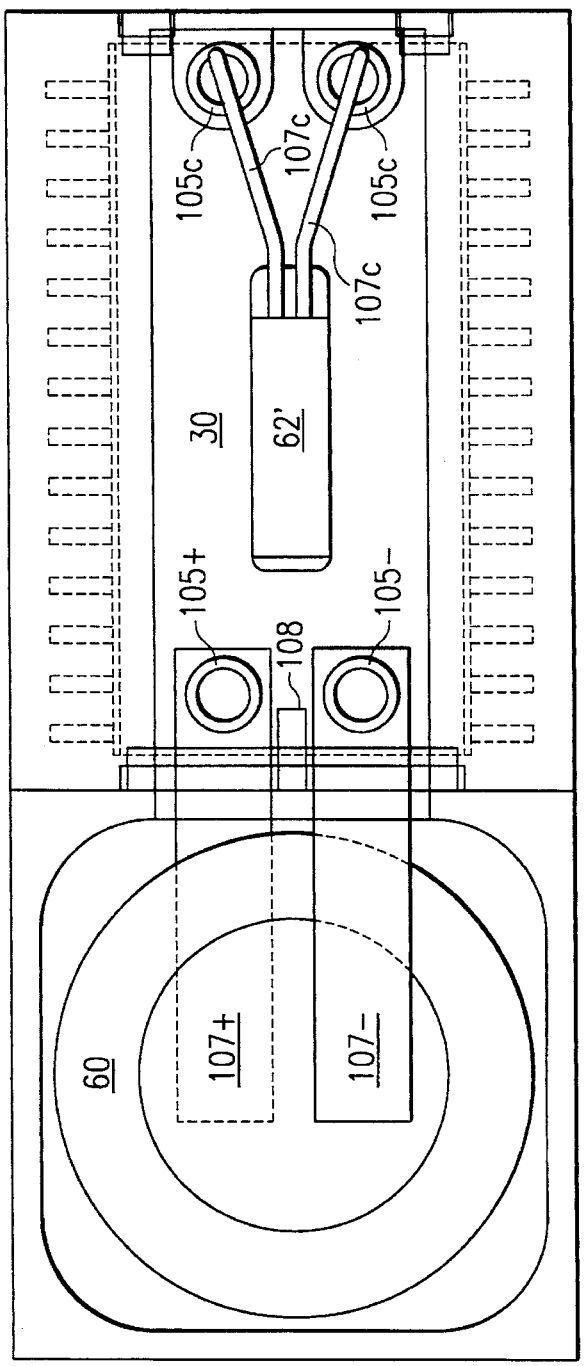
FIGS. 14a and 14b are plan and elevation views, respectively, of the module of FIGS. 13a and 13b after assembly to the chip package.
Figure 14B:
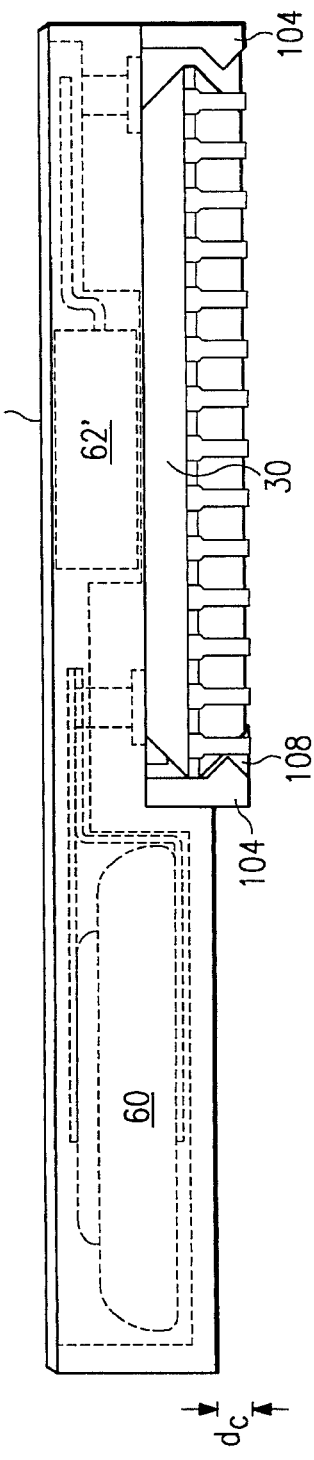

Referring now to FIGS. 14a and 14b, module 100 after its attachment to chip package 30 will now be described. As shown in FIG. 14b, lid 106 may optionally be provided to overlie cell 60 and crystal 62' (and any potting compound that is preferably inserted into base 102). As in the case of the embodiments described hereinabove, module 100 is preferably attached to chip package 30 after chip package 30 is mounted to its circuit board location, so that cell 60 and crystal 62' are not exposed to high temperatures in the solder reflow surface mount process. Attachment of module 100 to chip package 30 is accomplished merely by insertion of pin connectors 105 into corresponding sockets or receptacles in chip package 30, with lockout tab 108 fitting into a corresponding gap in chip package 30. Downward pressure applied to module 100 will then force snap members 104 around chip package 30 until mating, as described above.

As is evident from FIGS. 14a and 14b, after attachment of module 100 to chip package 30, crystal 62' is disposed directly above, and within the outline of, chip package 30, while cell 60 is located outside of the outline of chip package 30, adjacent one end thereof. The overall height of chip package 30 with module 100 attached thereto remains on the order of 0.200 inches, as the relative thinness of miniaturized crystal 62' allows its placement over and within the outline of chip package 30. The shadow of module 100, at the overhanging location of cell 60, remains above the plane of chip package leads 32 by clearance distance $d_c$ (e.g., on the order of 0.010 to 0.020inches), which allows conductive traces to pass thereunder. As is also evident from FIGS. 14a and 14b, no additional "shadow" is presented by module 100 due to the implementation of crystal 62', which is disposed directly over chip package 30. As such, the component density on the circuit board is impacted by module 100 to a lesser degree than by module 90 described hereinabove.

Each of the embodiments of the invention described herein provide significant advantages over conventional integrated circuit packaging schemes. Primarily, the present invention enables the installation of temperature sensitive components, such as electrochemical cells and crystal resonators, after surface mounting of the chip package to a circuit board. As such, surface mountable semiconductor devices with battery backup power, crystal-resonator-based clock signal generation, or both, may be implemented without risking degradation of the reliability of the cell, crystal and similar components due to exposure to the high solder temperatures or harsh chemicals. High density electronic systems may thus be implemented with substantially "on-chip" battery backup and crystal oscillator clocking.

In addition, the renewable mechanical and electrical connection provided by the module and chip package system of the present invention enables removal of the temperature sensitive components from the integrated circuit device without requiring detachment of the integrated circuit package from its circuit board location. As a result, rework of the circuit board does not cause a reduction in the reliability of the temperature sensitive components such as batteries, as these components may be removed therefrom during the rework operation. Useful system operation is also enhanced by the ability to replace a battery after its useful life has elapsed.

According to some embodiments of the present invention, additional advantages are also provided by the secure mechanical locking of the module to the chip package, including the presence of an audible snap sound to alert the worker that installation is proper. Furthermore, the present invention provides the significant advantage of improving both installation and removal of the module, and also of providing audible feedback indicating correct installation of the module. The lockout feature provided by certain of the preferred embodiments of the present invention also provides the distinct advantage of ensuring proper orientation of the module relative to the chip package.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A system for packaging integrated circuit components, comprising:
    a chip package, comprising:
        a body containing a semiconductor device;
        a plurality of leads extending from said body, said leads in electrical connection with the semiconductor device, and of the type suitable for surface mounting to a circuit board; and
        first and second terminals in electrical connection with the semiconductor device, and extending from said body; and
    a component module disposed over said chip package, comprising:
        an auxiliary body, having a first portion containing a first auxiliary component; and
        first and second connectors in electrical connection with the first auxiliary component, and extending from said auxiliary body to electrically connect with said first and second terminals, respectively, of said chip package;
    wherein the first portion of the auxiliary body does not overlie the chip package.

2. The system of claim 1, wherein the body of said chip package comprises molded plastic.

3. The system of claim 1, wherein said auxiliary component comprises a battery.

4. The system of claim 1, wherein the body of said chip package comprises a lockout tab extending therefrom;
    and wherein the auxiliary body of said component module comprises a lockout tab extending therefrom at a location corresponding to the lockout tab extending from body of said chip package if the first connector of the component module is mated with the second terminal of the chip package.

5. The system of claim 1, wherein said first and second connectors are removably mated with said first and second terminals, respectively.

6. The system of claim 1, wherein said first and second terminals are disposed at opposite ends of said chip package from one another.

7. The system of claim 1, wherein said chip package further comprises third and fourth terminals extending from the body of said chip package;
    and wherein said component module further comprises third and fourth connectors mating with said third and fourth terminals, respectively.

8. The system of claim 7, wherein said first auxiliary component is a battery, electrically connected to said first and second connectors.

9. The system of claim 8, wherein said auxiliary body also comprises a second portion, said second portion containing a crystal resonator electrically connected to said third and fourth connectors.

10. The system of claim 8, wherein the second portion of said auxiliary body also does not overlie said chip package.

11. The system of claim 8, wherein the second portion of said auxiliary body containing said crystal oscillator overlies said chip package.

12. A component module adapted to be mounted to a chip package, comprising;

a first auxiliary component;

a body having a first portion for housing said first auxiliary component and having a second portion; and first and second connectors extending from said second portion of said body, said first and second connectors in electrical connection with said first auxiliary component and positioned on the body so that, upon mounting to the chip package, the first portion of the body does not overlie the chip package and the second portion of the body overlies the chip package.

13. The component module of claim 12, further comprising:

a plurality of snap members extending from said body, said snap members adapted to snap around the chip package.

14. A component module adapted to be mounted to a chip package, comprising:

a battery;

a body having a first portion for housing said battery and having a second portion that overlies the chip package after mounting thereto; and first and second connectors extending from said second portion of said body, said first and second connectors in electrical connection with said first auxiliary component;

third and fourth connectors extending from said second portion of said body; and a crystal resonator disposed within said body in electrical connection with said third and fourth connectors.

15. The component module of claim 14, wherein said crystal resonator is disposed within said second portion of said body.

16. The component module of claim 14, wherein said body further comprises a third portion extending away from said second portion;

and wherein said crystal resonator is disposed within said third portion of said body.

* * * * *